United States Patent
Criminale et al.

(10) Patent No.: US 11,615,973 B2
(45) Date of Patent: Mar. 28, 2023

(54) SUBSTRATE CARRIER USING A PROPORTIONAL THERMAL FLUID DELIVERY SYSTEM

(71) Applicant: Applied Materials, Inc., Santa Clara, CA (US)

(72) Inventors: Phillip Criminale, Livermore, CA (US); Justin Phi, Milpitas, CA (US); Dan A. Marohl, San Jose, CA (US); Sergio Fukuda Shoji, San Jose, CA (US); Brad L. Mays, Findlay, OH (US)

(73) Assignee: Applied Materials, Inc., Santa Clara, CA (US)

( * ) Notice: Subject to any disclaimer, the term of this patent is extended or adjusted under 35 U.S.C. 154(b) by 725 days.

(21) Appl. No.: 16/656,334

(22) Filed: Oct. 17, 2019

(65) Prior Publication Data
US 2020/0051839 A1 Feb. 13, 2020

Related U.S. Application Data

(62) Division of application No. 14/555,467, filed on Nov. 26, 2014, now Pat. No. 10,490,429.

(51) Int. Cl.
*H01L 21/02* (2006.01)
*H01L 21/67* (2006.01)
(Continued)

(52) U.S. Cl.
CPC .. *H01L 21/67248* (2013.01); *H01J 37/32724* (2013.01); *H01L 21/67017* (2013.01); *H01L 21/67109* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 3,360,198 A | 12/1967 | Katchka | |
| 3,584,785 A | 6/1971 | Matulich | |

(Continued)

FOREIGN PATENT DOCUMENTS

| | | |
|---|---|---|
| CN | 101911278 | 12/2010 |
| CN | 102714913 | 10/2012 |

(Continued)

OTHER PUBLICATIONS

Final Preliminary Rejection from Korean Patent Application No. 10-2017-7002761 dated May 30, 2022, 4 pgs.

(Continued)

*Primary Examiner* — Ali Naraghi
(74) *Attorney, Agent, or Firm* — Schwabe, Williamson & Wyatt, P.C.

(57) ABSTRACT

A substrate carrier is described that uses a proportional thermal fluid delivery system. In one example the apparatus includes a heat exchanger to provide a thermal fluid to a fluid channel of a substrate carrier and to receive the thermal fluid from the fluid channel, the thermal fluid in the fluid channel to control the temperature of the carrier during substrate processing. A proportional valve controls the rate of flow of thermal fluid from the heat exchanger to the fluid channel. A temperature controller receives a measured temperature from a thermal sensor of the carrier and controls the proportional valve in response to the measured temperature to adjust the rate of flow.

7 Claims, 3 Drawing Sheets

(51) Int. Cl.
*H01J 37/32* (2006.01)
*H01L 21/683* (2006.01)

(56) References Cited

U.S. PATENT DOCUMENTS

| | | | |
|---|---|---|---|
| 3,654,948 A | 4/1972 | Nelson | |
| 3,877,637 A | 4/1975 | Motoyama | |
| 4,015,615 A | 4/1977 | Weber et al. | |
| 4,090,248 A | 5/1978 | Swanson et al. | |
| 4,117,372 A | 9/1978 | Walz | |
| 4,319,628 A * | 3/1982 | Hughes | F16K 31/365 165/278 |
| 4,367,699 A | 1/1983 | Evans | |
| 4,410,030 A | 10/1983 | Skala | |
| 4,535,222 A | 8/1985 | Moen | |
| 4,997,677 A | 3/1991 | Wang et al. | |
| 4,998,862 A | 3/1991 | Hutchinson | |
| 5,072,781 A | 12/1991 | Goodman | |
| 5,761,023 A | 6/1998 | Lue et al. | |
| 5,911,833 A | 6/1999 | Denison et al. | |
| 6,027,030 A | 2/2000 | Buijsse | |
| 6,353,210 B1 | 3/2002 | Norrbakhsh et al. | |
| 6,418,967 B1 | 7/2002 | Frei et al. | |
| 6,905,792 B2 | 6/2005 | Imaseki et al. | |
| 7,069,944 B2 | 7/2006 | Morikawa et al. | |
| 7,972,444 B2 | 7/2011 | Zucker et al. | |
| 8,278,224 B1 | 10/2012 | Mui et al. | |
| 8,550,112 B2 | 10/2013 | Bertelli | |
| 2002/0039006 A1 | 4/2002 | Herter et al. | |
| 2002/0143382 A1* | 10/2002 | Hijlkema | B29B 13/02 427/2.25 |
| 2003/0001510 A1 | 1/2003 | Vahab | |
| 2004/0056227 A1 | 3/2004 | Mayr et al. | |
| 2004/0216804 A1* | 11/2004 | Luehrsen | B01F 33/84 141/2 |
| 2004/0261712 A1 | 12/2004 | Hayashi et al. | |
| 2006/0016510 A1 | 1/2006 | Porter et al. | |
| 2006/0091115 A1 | 5/2006 | Higgins et al. | |
| 2006/0097644 A1 | 5/2006 | Kono et al. | |
| 2006/0156979 A1 | 7/2006 | Thakur et al. | |
| 2006/0180175 A1 | 8/2006 | Parent | |
| 2006/0255012 A1 | 11/2006 | Jacobson et al. | |
| 2007/0081295 A1 | 4/2007 | Brillhart et al. | |
| 2007/0175393 A1 | 8/2007 | Nishimura et al. | |
| 2007/0256432 A1 | 11/2007 | Zugibe et al. | |
| 2008/0223555 A1 | 9/2008 | Di Stefano | |
| 2008/0305632 A1 | 12/2008 | Nishimura et al. | |
| 2009/0114158 A1* | 5/2009 | Zucker | H01L 21/68 392/416 |
| 2009/0184089 A1 | 7/2009 | Chebi et al. | |
| 2010/0076611 A1 | 3/2010 | Cowans et al. | |
| 2010/0116788 A1 | 5/2010 | Singh et al. | |
| 2010/0152908 A1* | 6/2010 | Meier | F16K 37/0041 700/282 |
| 2010/0193501 A1 | 8/2010 | Zucker et al. | |
| 2010/0296248 A1 | 11/2010 | Campbell et al. | |
| 2011/0186545 A1 | 8/2011 | Mahadeswaraswamy et al. | |
| 2012/0012567 A1 | 1/2012 | Retnaswamy | |
| 2012/0132397 A1* | 5/2012 | Silveira | H01J 37/32926 118/712 |
| 2012/0161405 A1 | 6/2012 | Mohn et al. | |
| 2012/0180724 A1 | 7/2012 | Kouketsu et al. | |
| 2013/0126509 A1 | 5/2013 | He et al. | |
| 2013/0209766 A1 | 8/2013 | Felts et al. | |
| 2013/0276981 A1 | 10/2013 | Silveira et al. | |
| 2014/0011182 A1 | 1/2014 | Van Sickle et al. | |
| 2014/0034241 A1 | 2/2014 | Belostotskiy et al. | |
| 2014/0080320 A1 | 3/2014 | Okabe et al. | |
| 2014/0227880 A1 | 8/2014 | Shanker et al. | |
| 2015/0156921 A1 | 6/2015 | Yokohata | |
| 2015/0340255 A1* | 11/2015 | Parkhe | H01L 21/67248 165/80.5 |

FOREIGN PATENT DOCUMENTS

| | | |
|---|---|---|
| CN | 102907180 | 1/2013 |
| JP | 2000-193106 | 7/2000 |
| JP | 2002-276845 | 9/2002 |
| JP | 2007-024069 | 2/2007 |
| JP | 2007-107606 | 4/2007 |
| JP | 2007-299344 | 11/2007 |
| JP | 2011-142300 | 7/2011 |
| JP | 2012-508991 | 4/2012 |
| JP | 2013-519192 | 5/2013 |
| JP | 2013-534716 | 9/2013 |
| KR | 1020110117693 A | 10/2011 |
| KR | 10-2012-0130175 | 11/2012 |
| KR | 10-2013-0076828 | 7/2013 |
| WO | WO 2011/149615 A3 | 12/2011 |

OTHER PUBLICATIONS

Decision of Rejection from Japanese Patent Application No. 2017-505105 dated Dec. 25, 2020, 4 pgs.
Notice of First Office Action from Chinese Patent Application No. 201580042920.2 dated Oct. 28, 2019, 17 pgs.
Notice of Reasons for Rejection from Japanese Patent Application 2017-505105 dated Nov. 16, 2021, 14 pgs.
International Search Report and Written Opinion from PCT/US2015/062010, dated Feb. 29, 2016, 14 pgs.
Non-Final Office Action from U.S. Appl. No. 14/555,467 dated Mar. 29, 2017, 13 pgs.
International Preliminary Report on Patentability from PCT/US2015/062010 dated May 30, 2017, 10 pgs.
Non-Final Office Action U.S. Appl. No. 14/555,467, dated Nov. 20, 2017, 27 pgs.
Final Office Action from U.S. Appl. No. 14/555,467, dated Jun. 14, 2018, 26 pgs.
Non-Final Office Action from U.S. Appl. No. 14/555,467 dated Feb. 27, 2019, 33 pgs.
Official Letter for Taiwan Patent Application No. 104139247, dated Apr. 11, 2019, 13 pgs.
Notice of Reasons for Rejection from Japanese Patent Application No. 2017-505105 dated Sep. 13, 2019, 12 pgs.
Parker Pneumatic, P3P-R Series Electro-pneumatic Pressure Regulator, Documents Provided by Coast Pneumatics, Section C, Catalog 0700P-2/USA, 11 pgs.
Preliminary Rejection from Korean Patent Application No. 10-2017-7002761 dated Mar. 22, 2022, 8 pgs.
Search Report from Chinese Patent Application No. 2015800429202 dated Jun. 20, 2019, 2 pgs.
Official Letter from Taiwanese Patent Application No. 108131771 dated Apr. 10, 2020, 5 pgs.
Notice of Reasons for Rejection from Japanese Patent Application No. 2017-505105 dated Apr. 23, 2020, 12 pgs.
Notice of Reasons for Rejection from Japanese Patent Application No. 2021-078249 dated Nov. 30, 2022, 6 pgs.

* cited by examiner

SUBSTRATE CARRIER USING A PROPORTIONAL THERMAL FLUID DELIVERY SYSTEM

CROSS-REFERENCE TO RELATED APPLICATIONS

This application is a divisional of U.S. patent application Ser. No. 14/555,467, filed on Nov. 26, 2014, the entire contents of which are hereby incorporated by reference herein.

TECHNICAL FIELD

Embodiments of the present invention relate to the microelectronics manufacturing industry and more particularly to temperature controlled supports for supporting a workpiece during plasma processing.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the silicon wafer may be held in place by an electrostatic chuck (ESC), a carrier, a pedestal, or a variety of other structures. An ESC holds the wafer by generating an electrostatic field to clamp the back side of the wafer to a flat surface or puck surface of the chuck. Other carriers use vacuum pressure, adhesive or other techniques.

As fabrication techniques for plasma processing equipment advance, such as those designed to perform plasma etching of microelectronic devices and the like, the temperature of the wafer during processing becomes more important. ESCs have been designed to provide a particular thermal profile across the surface of the substrate, sometimes called a workpiece. ESC's have also been designed to precisely regulate the temperature of the workpiece.

ESCs use liquid cooling to absorb the plasma power heat and remove it from the chuck. An ESC may also use the liquid to heat the chuck. This allows for a wider process window under different process and plasma conditions. A heat exchanger is used to heat or cool the liquid before it is pumped through the chuck and then valves control the rate of flow and the mixture of hot and cold fluid that is pumped through the chuck. A more precise thermal performance allows for more precisely formed structures on the wafer.

SUMMARY

A substrate carrier is described that uses a proportional thermal fluid delivery system. In one example the apparatus includes a heat exchanger to provide a thermal fluid to a fluid channel of a substrate carrier and to receive the thermal fluid from the fluid channel, the thermal fluid in the fluid channel to control the temperature of the carrier during substrate processing. A proportional valve controls the rate of flow of thermal fluid from the heat exchanger to the fluid channel. A temperature controller receives a measured temperature from a thermal sensor of the carrier and controls the proportional valve in response to the measured temperature to adjust the rate of flow.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
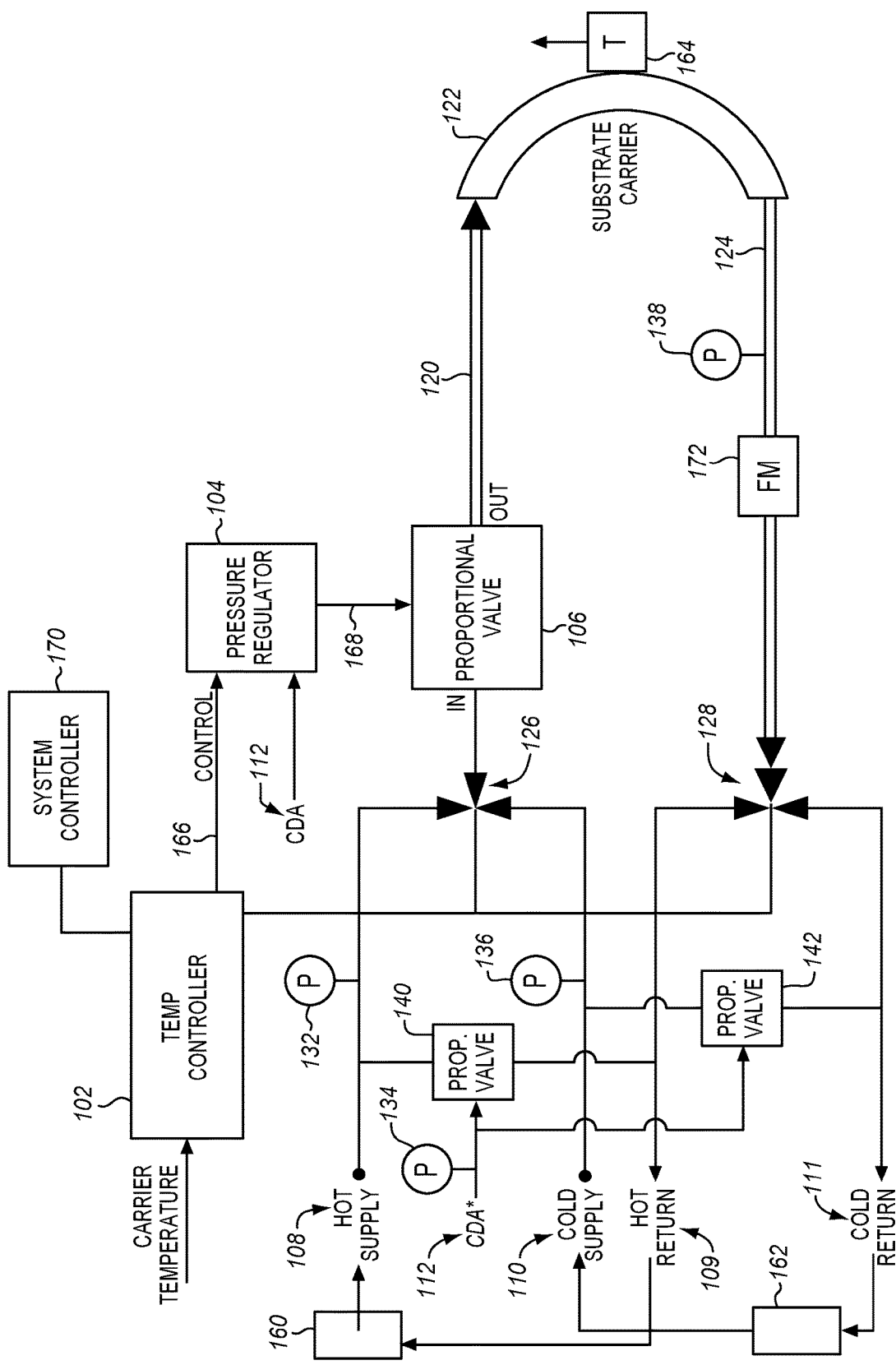
FIG. 1 is a diagram of a temperature regulation system using proportional fluid flow control of a wafer support according to an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

The temperature of a substrate support, such as an electrostatic chuck (ESC) or vacuum chuck may be controlled using a proportional fluid delivery system. A pulsing fluid delivery system quickly cycles a fluid valve open and closed. The open duty cycle determines the amount of fluid which flows to the chuck. This is not as accurate or reliable as a proportional control system. The flow rates allowed by a proportional value meet the cooling demands of plasma processes with high bias RF power. These include those processes that are used for high aspect ratio etch structures. Without a closed loop temperature control system, the chuck temperature will steadily increase with the introduction of high RF power during wafer processing. The described closed loop system provides steady state temperature control which will improve etch shape performance while the wafer is being processed.

FIG. 1 is a diagram of a temperature regulation system for a wafer support such as an ESC or vacuum chuck as described above. The system has a source 108 and return 109 for hot fluid. The return feeds the fluid back to a heat exchanger 160 that heats the fluid to a predetermined temperature or by a regulated amount and provides the fluid under pressure to the supply line 108. The fluid temperature may be fixed or adjusted based on a control signal. Similarly the system has a source 110 and return 111 for cool fluid. A second heat exchanger 162 receives the cool return and cools it to a predetermined temperature or by a regulated amount. The first and second heat exchangers may be a single unit or two separate devices. The heat exchangers may be thermostatically controlled or they may apply a fixed amount of heating or cooling based on the design with or without any specific control. The temperature of the coolant 120 that is circulated through the substrate carrier 122, as described below, is controlled in part by the temperature of the supplied hot 108 and cold 110 fluids but also by the flow rate and the mixture of hot and cold. The system provides a fluid output line 120 that is pumped to the carrier 122 and a return line 124 that returns the fluid from the carrier.

The hot fluid supply is provided to a 3-way valve 126 which opens or closes the flow of hot fluid from the heat exchanger. The cold fluid supply is similarly provided to the same 3-way valve which opens or closes the flow of cold fluid from the second heat exchanger. Fluid that is allowed through this valve is provided to the substrate carrier 122 in a carrier supply line 120 to heat or cool the substrate carrier. There is an additional 3-way valve 128 coupled to the hot and cold return lines 109, 111. Fluid from the substrate carrier is returned in a carrier return line 124 to this valve 128 and allowed to pass through this valve back to the respective heat exchanger from which the fluid came. The 3-way valves are operated under the control of a temperature controller 102 that is coupled to the two valves.

The temperature controller 102 receives a temperature signal from a thermal sensor 164, such as an optical temperature probe, that is attached to a substrate in a process chamber or a substrate carrier 122 to determine the temperature of the substrate either directly or indirectly. Based on this received temperature, the controller opens and closes the hot and cold valves and controls the flow rate through the substrate carrier 122. The controller 102 uses the probe 164 temperature to determine the error from a temperature set point and generates an output voltage using, for example, a PID (Proportional Integral Derivative) controller.

The controller 102 determines the flow rate and cooling medium to use, either hot 108 or cold 110 fluids, in the substrate carrier fluid channel 120. In some embodiments, the fluid provided by the cold heat exchanger is at about 0° C. and the fluid provided by the hot heat exchanger is at about 55° C. Depending on the current temperature of the carrier, either one of these is delivered to the fluid channel. If the carrier temperature is above the set point, then the fluid from the cold chiller is used. If the temperature is below the set point, then the fluid from the hot chiller is used. The fluid delivery system controls the temperature control medium 120 using a variable flow valve 106 to within an appropriate temperature range. The fluid delivery system also controls temperature ramp up and overshoot during plasma processing.

To control the flow rate, the temperature controller 102 generates a valve control signal, for example an analog voltage and supplies that signal to a pressure regulator 104. The pressure regulator generates a pressure based on the valve control signal and provides the pressure to a flow control valve 106. The flow control valve opens or closes the passageway from the heat exchangers 160, 162 to the substrate carrier 122 by an amount that depends on the supplied pressure. The flow rate of heating or cooling fluid through the carrier is therefore controlled by the flow control valve 106. The flow control valve accordingly, controls the amount of heating or cooling that is applied to the substrate carrier. A higher flow rate allows the fluid to transfer more heat to or from the carrier. The carrier is thermally coupled to the substrate in the processing chamber. As a result, a higher flow rate of cool fluid will remove more heat from the carrier. A higher flow rate of hot fluid will transfer more heat to the carrier.

In the illustrated example, the temperature controller 102 is coupled to an electro-pneumatic regulator 104. Such a regulator is supplied with a CDA (Compressed Dry Air) input 112 at a controlled and typically constant pressure. The regulator regulates the input CDA to produce a precise pneumatic air pressure signal 168 in response to an electrical control signal 166 from the thermal controller. If a stepless analog signal is provided to the regulator, then the regulator may provide a regulator air pressure that also varies steplessly. This regulated pneumatic control pressure is applied to the top of the pressure regulated valve 106.

In some embodiments, the CDA is applied to an air supply solenoid valve of the regulator 104. As the input control voltage 166 increases, the solenoid valve opens. The pressure released through the air supply valve is measured by a sensor and fed to a control circuit. The air supply valve is adjusted until the measured pressure aligns with the pressure indicated by the control signal. An exhaust solenoid valve is provided to relieve pressure within the regulator back to the CDA supply.

The pressure regulated valve 106 provides proportional fluid control in response to the control pressure 168 from the pressure regulator 104. This allows for a stepless control of the fluid flow 120 from the 3-way valve 126 through the carrier 122. The valve moves very little compared to a pulsed valve. This provides a longer hardware life with less servicing. In addition, the response to temperature changes is smoother. Using a variable flow-rate with no continuous fluid off times during plasma processing, the temperature response is smoother temperature oscillations are reduced.

In some embodiments, the pressure regulated valve has an upper chamber in the valve body with an upper diaphragm that moves in response to air pressure supplied to the upper chamber. The upper diaphragm in the upper chamber is coupled through a shaft to a lower valve gate or diaphragm in a lower chamber of the valve body. The upper diaphragm moves against a spring in response to the air pressure to move the lower gate or diaphragm by means of the connecting shaft. The lower chamber receives the fluid from the 3-way valve 126 at an inlet and then varies the flow rate to an outlet based on the position of the gate or lower diaphragm. Using a flow meter 172 a control feedback loop may be used to provide the desired flow rate through the proportional valve.

A hot fluid return valve 140 allows heating fluid to flow from the hot supply to the hot return bypassing the substrate carrier 122. A similar cool fluid return valve 142 allows cooling fluid to flow from the cool supply to the cool return directly without passing through the carrier. When either the hot or the cold supply is not supplied to the carrier because of the settings of the 3-way valves 126, 128, the hot and cold fluid return valves 140, 142 allow fluid to flow through the corresponding heat exchanger without flowing through the carrier. This allows the corresponding heat exchanger to establish a steady temperature and keep the supply of fluid at the desired temperature.

As shown, these fluid bypass valves 140, 142 may also be proportional valves controlled by a regulated CDA (Compressed Dry Air) source 112 or by an unregulated on/off CDA. These valves may also be controlled by the temperature controller to provide the desired flow in conjunction with the 3-way valves.

The temperature regulation system may also include a variety of pressure sensors 132, 134, 136, 138 and flow meters 172. These may be coupled to a system controller 170 that controls the temperature controller 102, the heat exchangers 160, 162, the substrate carrier 122 and other aspects of the processes being performed on the substrate. A pressure sensor 132, 136 on each of the hot and cold supplies allows the operation of the heat exchangers to be measured. A pressure sensor 134 on each of the CDA inputs allows the CDA compression to be measured and adjusted accordingly.

A flow meter 172 in the fluid line 122, 124 through the carrier allows the rate of flow to be measured. The measured flow rate may then be adjusted using the proportional valve 106, if desired. The pressure in the line may also be measured with a pressure sensor 138 and adjusted using the proportional valve. In the illustrated example, the flow rate and the pressure are measured in the return line 124 from the carrier. This allows system operation through the carrier to be checked as the system is in operation. Any flow or pressure loss will be observed and the effect of changing the position of the proportional valve may also be measured.

The described temperature regulation system allows the temperature of fluid flowing through a channel in a substrate carrier to be controlled with a range of, for example, 0° C. to 55° C. The substrate carrier may have more than one thermal fluid channel in which case, the system of FIG. 1 may be duplicated to support each additional channel. Because the mixture into the pressure regulated valve 106 and the flow rate through the pressure regulated valve may be independently controlled, a single hot and a single cold heat exchanger may be used to provide fluid to more than one channel.

Figure 2:
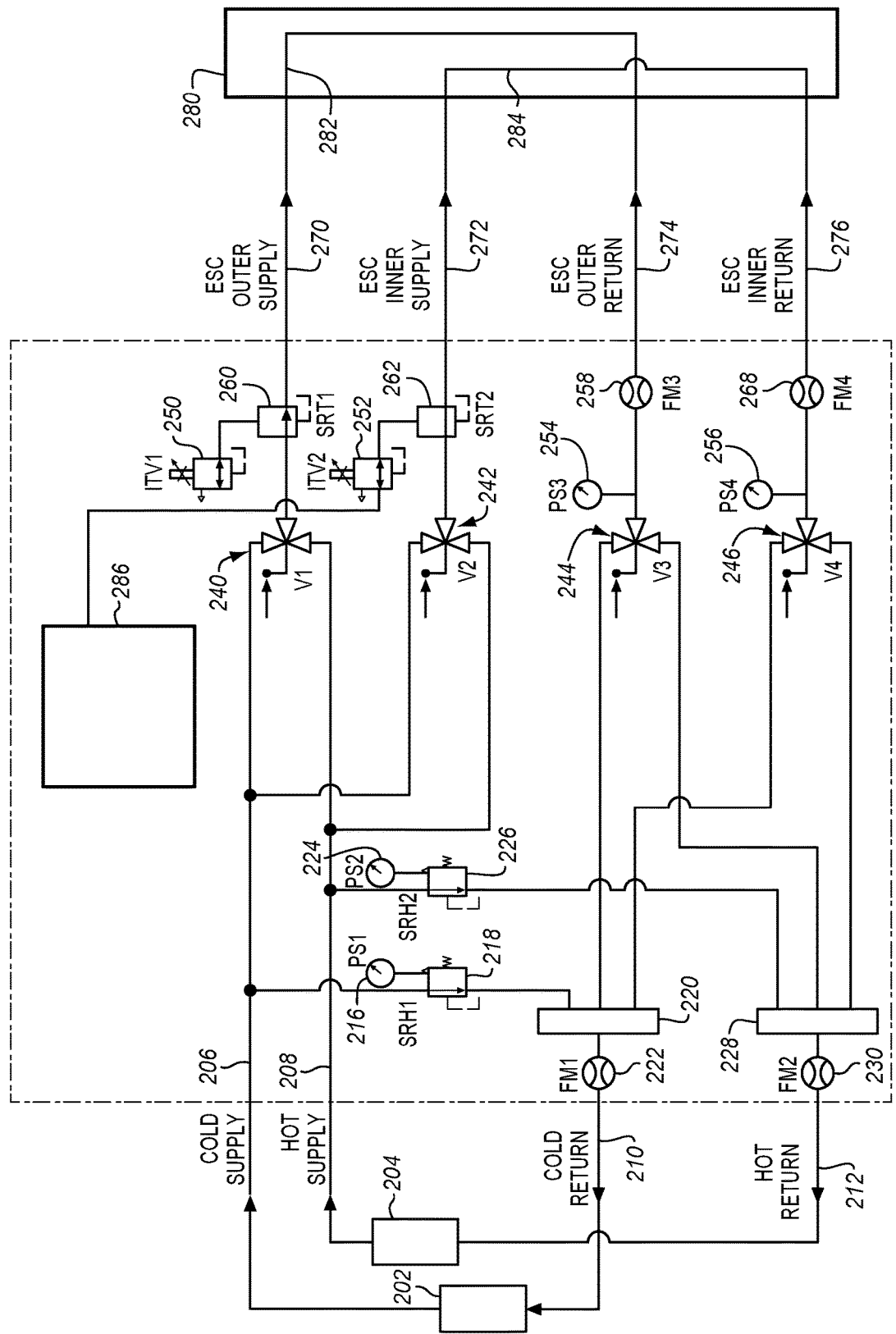
FIG. 2 is an alternative configuration for temperature regulation using proportional fluid flow according to an embodiment of the present invention.

FIG. 2 shows an example, configuration for a substrate carrier, such as an ESC 280 with an outer thermal fluid channel 282 and in inner thermal fluid channel 284. The outer and inner channels may be used to compensate for different conditions on different locations of the substrate. For wafer plasma processing, for example, the outer edge of the wafer tends to heat faster than the interior of the wafer because the outer edge of the wafer has more surface area exposed to the chamber. In such an example, more cooling fluid flow may be provided to the outer fluid channel than the inner fluid channel so that the wafer may be maintained at a more consistent temperature across its surface. The principles of FIG. 2 may be applied to other types of ESCs and other types of substrate carriers in which independent control is used for more than one fluid channel.

A cold supply heat exchanger 202 provides chilled thermal fluid to a cold supply line 206. The cold supply is fed through a bypass valve 218 to a cold return manifold 220 which returns the cold supply through a cold return line 210 to the cold heat exchanger. The bypass valve 218 may be controlled using a pressure sensor 216. When the pressure in the cold supply line 206 is high then the bypass valve is opened by the pressure sensor to relieve pressure in the line. When the pressure in the cold supply line is low, then the bypass valve is closed to ensure that there is sufficient pressure to support the operation of the system. A cold flow meter 222 in the cold return line provides another sensor that combined with the pressure sensor 216 may be used by a thermal controller (not shown) or system controller (not shown) to ensure proper system operation.

The bypass valve 218 may be a diaphragm valve that may be manually operated or controlled by an external controller. The bypass valve is partially self-regulating based on pressure and may also be controlled by the pressure sensor. The bypass valve for the cold and another 226 for a hot return 212 help to ensure smooth changes in flow rates and continued flow during all operational modes.

A hot supply heat exchanger 204 similarly provides heated thermal fluid to a hot supply line 208. The hot supply line is fed through a hot bypass valve 226 controlled by a pressure sensor 224 to feed back the hot supply to a return manifold 228. The hot thermal fluid in the return manifold is fed to a hot return line and back to the hot supply heat exchanger 204. The hot return line also has a flow meter 230 to measure the flow in the return line from all sources.

The cold and hot thermal fluid supply is fed to a first 3-way valve 240 which selects either cold or hot thermal fluid or both for the outer cooling channel 282. The same cold and hot thermal fluid supply is also fed to a second 3-way valve 242 which selects either cold or hot thermal fluid or both for the inner cooling channel 284 of the ESC 280. The flow rate of the output from each of the 3-way valves is controlled by a respective proportional valve 260, 262, such as a pressure regulated valve as described above. However, as with the example of FIG. 1 any other type of proportional valve may be used. Each proportional valve has a respective valve controller 250, 252, such a pressure regulator as described above. The pressure regulators are coupled to a CDA source 286 and a control signal (not shown) from the thermal controller. The two proportional valves provide for independent control of the flow rate through each cooling channel. Using the configuration of FIG. 2, both the temperature and the flow rate of the thermal fluid through each cooling channel is independently controlled while the heat exchangers are shared.

The flow rate and temperature controlled fluid is provided from the outer channel proportional valve 260 to an outer channel supply line 270 to the outer channel 282 of the ESC 280. It flows through the outer channel of the ESC to an outer return line 274. Similarly, the flow rate and temperature controlled fluid from the inner channel proportional valve 262 is provided to an inner channel supply line 272 to the inner channel 284 of the ESC 280. It flows through the inner channel of the ESC to an inner return line 276.

The ESC return lines 274, 276 are fed back to the heat exchangers to be cooled or heated depending on the fluid source. The outer return 274 is passed through a flow meter 258 and then a pressure sensor 254 to a 3-way valve 244. The 3-way valve routes the return fluid to return manifold 220, 228 of the heat exchanger 202, 204 from which the thermal fluid came. Similarly, the inner return line 276 is passed through a flow meter 268 and a pressure sensor 256 to a different 3-way valve 246. The 3-way valve is also coupled to the return manifolds 220, 228 to return the fluid from the inner channel to the corresponding heat exchanger 202, 204.

The four 3-way valves 240, 242, 244, 246 may all be controlled by the temperature controller to ensure route the thermal fluids to supply and return lines as desired. When one of the heat exchangers is not coupled to any of the supply lines, then a corresponding bypass valve 218, 226 may be opened. The flow and pressure sensors throughout the system allow the system to be monitored at all times at different points to ensure proper operation.

Figure 3:
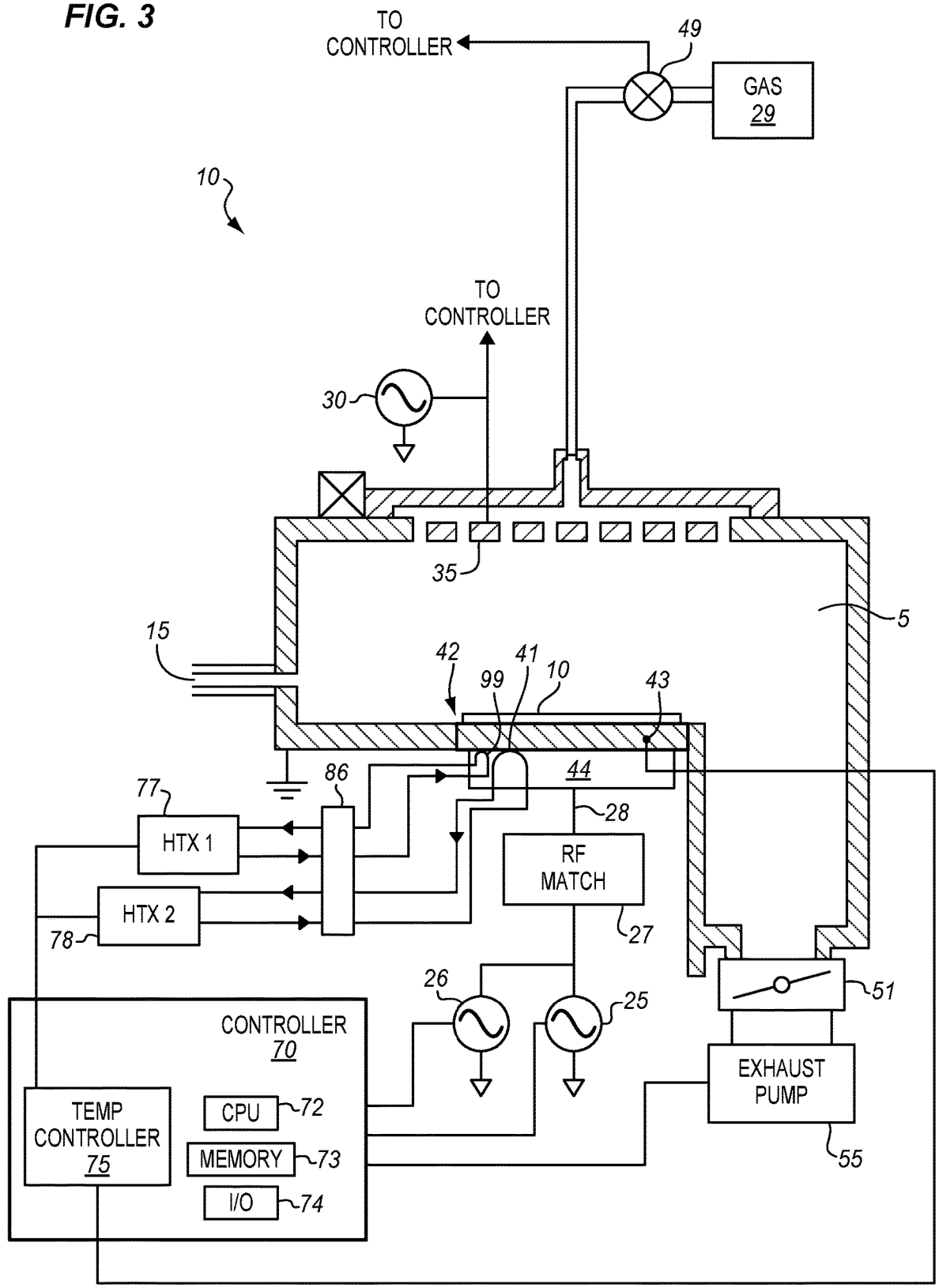
FIG. 3 is an alternative diagram of a plasma processing apparatus for a workpiece using a pedestal and a proportional valve fluid control system according to an embodiment of the present invention.

FIG. 3 is a schematic of a plasma etch system 10 including a chuck assembly 42 in accordance with an embodiment of the present invention. The plasma etch system 10 may be any type of high performance etch chamber known in the art, such as, but not limited to, Enabler®, DPS II®, AdvantEdge™ G3, EMAX®, Axiom®, or Mesa™ chambers, all of which are manufactured by Applied Materials of California, USA. Other commercially available etch chambers may similarly utilize the chuck assemblies described herein. While the exemplary embodiments are described in the context of the plasma etch system 10, the chuck assembly described herein is also adaptable to other processing systems used to perform any plasma fabrication process (e.g., plasma deposition systems, etc.)

Referring to FIG. 3, the plasma etch system 10 includes a grounded chamber 5. Process gases are supplied from gas source(s) 29 connected to the chamber through a mass flow controller 49 to the interior of the chamber 5. Chamber 5 is evacuated via an exhaust valve 51 connected to a high capacity vacuum pump stack 55. When plasma power is applied to the chamber 5, a plasma is formed in a processing region over a workpiece 10. A plasma bias power 25 is coupled into a chuck assembly 42 to energize the plasma. The plasma bias power 25 typically has a low frequency between about 2 MHz to 60 MHz, and may be, for example, in the 13.56 MHz band. In an example embodiment, the plasma etch system 10 includes a second plasma bias power 26 operating at about the 2 MHz band which is connected to an RF match 27. The plasma bias power 25 is also coupled to the RF match and also coupled to a lower electrode via a power conduit 28. A plasma source power 30 is coupled through another match (not shown) to a plasma generating element 35 to provide high frequency source power to inductively or capacitively energize the plasma. The plasma source power 30 may have a higher frequency than the plasma bias power 25, such as between 100 and 180 MHz, and may, for example, be in the 162 MHz band.

A workpiece 10 is loaded through an opening 15 and clamped to a chuck assembly 42 inside the chamber. The workpiece 10, such as a semiconductor wafer, may be any wafer, substrate, or other material employed in the semiconductor processing art and the present invention is not limited in this respect. The workpiece 10 is disposed on a top surface of a dielectric layer or puck of the chuck assembly that is disposed over a cooling base assembly 44 of the chuck assembly. A clamp electrode (not shown) is embedded in the dielectric layer. In particular embodiments, the chuck assembly 42 may include two or more different fluid channel zones, such as an inner channel 41 and an outer channel 99. Each channel 41, 99 may be independently controllable to the same or to different temperature set points.

A system controller 70 is coupled to a variety of different systems to control a fabrication process in the chamber. The controller 70 may include a temperature controller 75 to execute temperature control algorithms (e.g., temperature feedback control) and may be either software or hardware or a combination of both software and hardware. The system controller 70 also includes a central processing unit 72, memory 73 and input/output interface 74. The temperature controller 75 is to output control signals affecting the rate of heat transfer between the chuck assembly 42 and a heat source and/or heat sink external to the plasma chamber 5 for the various fluid channels 41, 99. The temperature controller 75 may be coupled to one or more temperature probes 43 which may be in or on the substrate carrier, coupled to fluid supply lines, or in any other desired location.

The thermal fluid zones may include separate, independently controlled thermal fluid heat transfer loops with separate flow control that is controlled based on a zone-specific temperature feedback loop as described above. In the example embodiment, the temperature controller 75 is coupled to a first heat exchanger (HTX)/chiller 77 and may further be coupled to a second HTX/heater 78 and more heat exchangers (not shown) as desired depending on the particular implementation. The flow rate of the heat transfer fluid or coolant through conduits in the chuck assembly 42 is controlled by a proportional valve system 86 as described above.

The proportional valve system is 86 controlled by the temperature controller 75 to independently control a rate of flow of the thermal fluid or heat transfer fluid to each of the different fluid channels. The temperature controller may also control the temperature set point used by each heat exchanger to cool or heat the thermal fluid. Accordingly, each heat exchanger may bring the thermal fluid for its respective coolant channel to a different temperature before providing it back to the fluid channels.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes the ESC in the context of a plasma processing chamber, the ESC described herein may be used in a variety of different chambers and for a variety of different processes. A different substrate carrier may be used instead of an ESC, depending on the particular implementation.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method for processing a workpiece comprising:
generating a plasma containing gas ions in a plasma chamber;
applying the plasma to a workpiece on a workpiece holder;
regulating a temperature of the workpiece through a thermal fluid channel of the workpiece holder, using a heat exchanger to provide a thermal fluid to the fluid channel and to receive the thermal fluid from the fluid channel, the thermal fluid in the fluid channel to control the temperature of the workpiece carrier during substrate processing using a proportional valve to control the flow rate of the thermal fluid from the heat exchanger to the fluid channel and a temperature controller to receive a measured temperature from a thermal sensor of the workpiece holder and to control the proportional valve in response to the measured temperature to adjust the flow rate of the thermal fluid, wherein the heat exchanger provides a cold thermal fluid and the second heat exchanger provides a hot thermal fluid, and wherein the cold thermal fluid and the hot thermal fluid comprise polyethers.

2. The method of claim 1, wherein controlling the flow rate comprises the temperature controller providing an analog voltage signal to a pressure regulator and the pressure regulator providing a fluid pressure to the proportional valve in response to the analog voltage signal to control the proportional valve.

3. The method of claim 2, wherein the proportional valve is an analog flow valve with a passageway that is opened or closed by an amount that depends on the fluid pressure.

4. The method of claim 2, wherein the analog voltage signal is stepless and wherein the fluid pressure is stepless.

5. The method of claim 2, wherein the fluid pressure provided to the pressure regulated valve is supplied by compressed dry air.

6. The method of claim 1, further comprising receiving a fluid pressure from a pressure sensor and a fluid flow rate from a flow meter in the fluid channel and the temperature controller controlling the proportional valve in response to the pressure sensor and the fluid channel.

7. The method of claim 1, wherein the proportional valve comprises a pressure regulated valve, wherein the proportional valve comprises a valve body with an upper chamber and a lower chamber, and wherein an upper diaphragm in the upper chamber is coupled to a lower diaphragm in the lower chamber.

* * * * *